(12) United States Patent
Smithson

(10) Patent No.: US 6,193,532 B1
(45) Date of Patent: Feb. 27, 2001

(54) PRINTED CIRCUIT BOARD CARRIER INSERTION/EXTRACTION ASSEMBLY

(75) Inventor: Stephen D. Smithson, Redwood, CA (US)

(73) Assignee: Silicon Graphics, Inc., Mountain View, CA (US)

( * ) Notice: Subject to any disclaimer, the term of this patent is extended or adjusted under 35 U.S.C. 154(b) by 0 days.

(21) Appl. No.: 09/408,969

(22) Filed: Sep. 29, 1999

(51) Int. Cl.[7] .................................................... H01R 13/62
(52) U.S. Cl. ............................................................. 439/157
(58) Field of Search ...................................... 439/152, 153, 439/154, 155, 157, 160, 928.1, 377; 361/683, 684, 685

(56) References Cited

U.S. PATENT DOCUMENTS

| | | | |
|---|---|---|---|
| 5,238,418 | * 8/1993 | Koiner | 439/157 |
| 5,385,870 | * 1/1995 | Maue et al. | 439/157 |
| 5,586,003 | * 12/1996 | Schmitt et al. | 439/157 |
| 5,654,873 | 8/1997 | Smithson et al. | 361/685 |
| 5,975,735 | * 11/1999 | Schmitt | 439/157 |

\* cited by examiner

*Primary Examiner*—Paula Bradley
*Assistant Examiner*—Tho D. Ta
(74) *Attorney, Agent, or Firm*—Schwegman, Lundberg, Woessner & Kluth, P.A.

(57) ABSTRACT

An assembly designed to increase the ease with which a printed circuit board carrier may be inserted or extracted from an enclosure. The assembly includes a movable lever mounted to the carrier and curved pin slot in the enclosure. A pin on the lever engages the curved pin slot. During insertion, the shape of the pin slot guides the carrier into its position, then the lever rotates to place the pin in a portion of the pin slot that is oriented in a substantially different direction from the direction of insertion, thus holding the carrier in place. During removal, the pin holds the carrier in place while the lever rotates away from the carrier and thus becomes accessible to permit removal of the carrier by pulling on the lever. Two assemblies, one on each side of the carrier, are typically used.

19 Claims, 6 Drawing Sheets

PRINTED CIRCUIT BOARD CARRIER INSERTION/EXTRACTION ASSEMBLY

TECHNICAL FIELD

This invention is concerned with rapid installation or removal of electronic printed circuit boards into or from an enclosure.

BACKGROUND

Many pieces of electrical and electronic equipment are made up of "rack mounted" enclosures printed circuit boards that slide into or out of position along fixed immobile racks. There is a strong trend towards operating such equipment continuously during the installation or removal of any circuit boards. During such "hot swapping," it must be possible to access the board of interest very quickly but without compromising safety, grounding, operation and electrical shielding of adjacent boards, and so forth. The increasingly smaller sizes and closer mountings of modular electronic equipment make this a difficult task, in part because both the number and the density of the connecting pins between boards are increasing as the electronics becomes more sophisticated. Thus, accurate alignment of the circuit board into the rack is important, but achieving such alignment can be time-consuming.

One approach to the problems presented by these conditions are board carriers, which are modular frames that fit closely within the rack and can carry a variety of boards of different functions. The carriers are carefully designed to hold the circuit boards in their proper position while the carrier is inserted into the rack along rails. The carriers may be inserted with relatively less accuracy than is required by the circuit board itself, because the design of the rail system provides the needed accurate alignment as the carrier is moved down the rail into the rack.

DISCLOSURE OF INVENTION

The invention is an assembly designed to increase the ease with which a printed circuit board carrier may be inserted or extracted from an enclosure. The assembly includes a movable lever mounted to the carrier, and a guide piece mounted to the enclosure. A pin on the lever engages a curved pin slot within the guide piece.

During insertion, the shape of the pin slot first requires the pin to pass through a portion of the carrier that is substantially parallel to the direction of insertion, but does not permit rotation of the lever. After passing through this first portion of the pin slot, the pin will be at the entrance to a second portion of the guide slot, which means that the carrier will be in a position at which the lever may rotate. Such rotation places the pin in a second portion of the pin slot that is oriented in a substantially different direction from the direction of the first portion. When the pin in fully inserted in this second portion, the carrier is held in place.

During removal, the same second portion of the pin slot constrains the pin enough to hold the carrier in place while the lever rotates away from the carrier. Eventually the lever rotates enough to place the pin in the first portion of the pin slot, i.e., the portion is substantially parallel to the direction of removal of the carrier. At that point, the carrier may be removed by pulling on the lever, because the pin may pass freely through the first portion of the pin slot.

Two mirror-image assemblies, one on each side of the carrier, are typically used.

DETAILED DESCRIPTION

Figure 1:
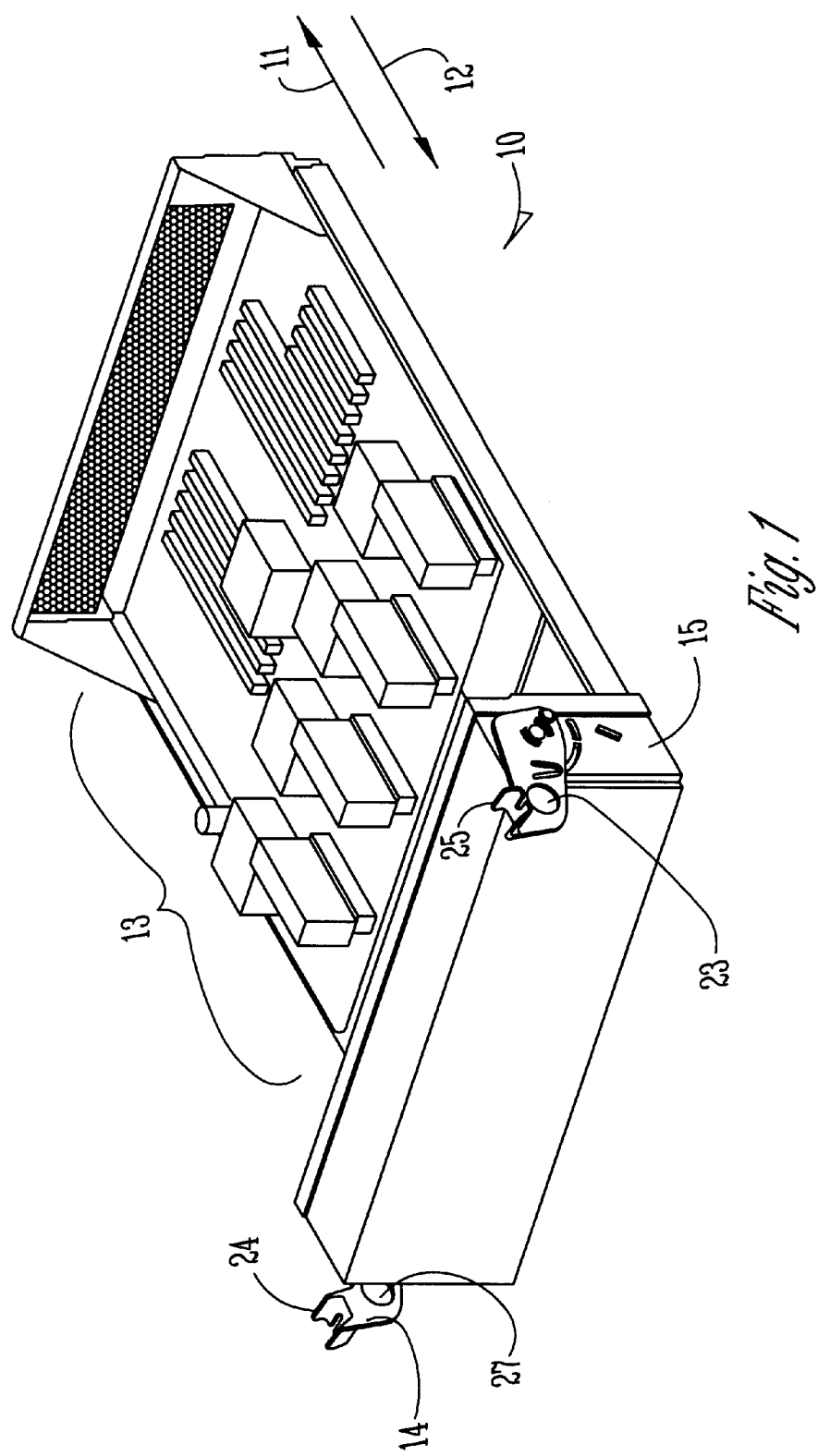
FIG. 1 is a perspective view of one embodiment of the invention.

FIG. 1 is a perspective view of one embodiment of the invention. Printed circuit board carrier 10 is designed to be inserted into an enclosure (not shown in FIG. 1) in the direction indicated by arrow 11 and removed from the enclosure in the direction indicated by the arrow 12.

Carrier 10 holds one or more printed circuit boards 13. Printed circuit boards 13 may be designed to interconnect physically with other electronic components at the back end of the enclosure, using ports or other connectors extending out the rearmost portion of carrier 10. Alternatively, carrier 10 may simply hold printed circuit boards 13 in place so that connections between them and other electronic components within the enclosure may be made by cables, as is commonly done within personal computers. Either approach is within the scope of the invention.

Similarly, while the dimensions of carrier 10 are in no way a limitation on the scope of the invention, for reference purposes one may consider an embodiment of carrier 10 suitable for insertion into an enclosure which is then mounted within an industry standard rack having an opening width of approximately nineteen inches (48.26 cm). In this embodiment, carrier 10 may be approximately seventeen and one-half inches (44.45 cm) wide, approximately twenty-six and one-half inches (67.31 cm) deep, and approximately five inches (12.7 cm) tall.

In the preferred embodiment, mounted to each side of the front end of carrier 10 are actuation lever subassemblies 14 and 15. The use of only a single actuation lever subassembly is possible. To accomplish the function of moving them at a common rate (if not actually joining them to move in common), it is possible to link actuation lever subassemblies 14 and 15 together with a shaft or common handle or any other means for linking them together (not shown). However, such an embodiment is not preferred because the additional pieces will that physically interfere with whatever other components (not shown) may be located at the front of the carrier, such as fans, diagnostic displays, etc.

For efficiency in manufacturing, it is preferred that actuation lever subassemblies 14 and 15 are mirror-image symmetric with each other, and therefore only a single lever subassembly will be further discussed below.

Figure 2:
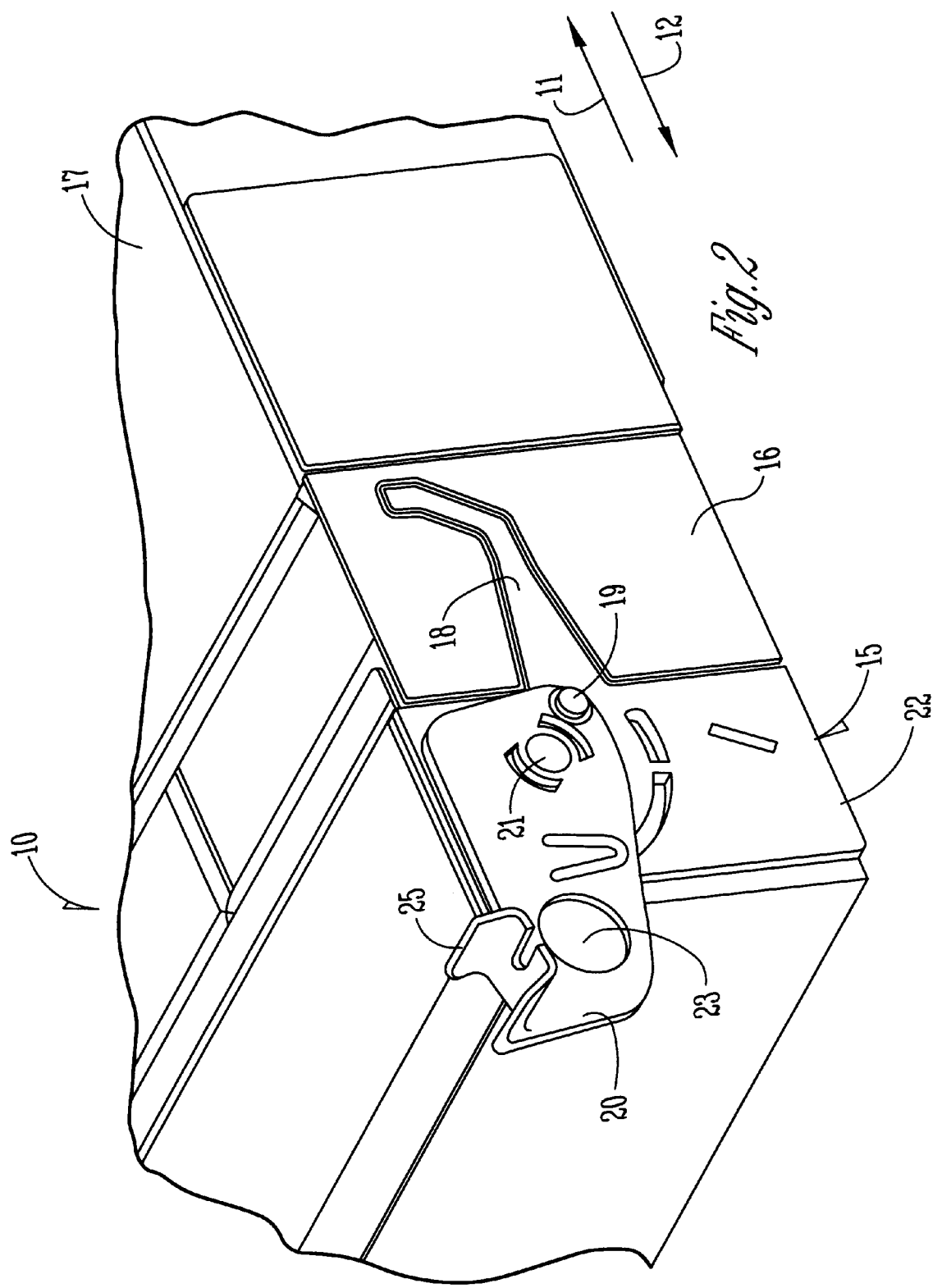
FIG. 2 is a closeup perspective view of the embodiment of FIG. 1.

FIG. 2 is a closeup perspective view of the embodiment of FIG. 1, and further including a portion of enclosure 17. For purposes of illustration only, a portion of enclosure 17 is illustrated as a separate guide piece 16, which could be attached to enclosure 17 by any convenient means (not shown). The scope of the invention does not require a separate guide piece 16; instead, the features and functions of guide piece 16 may be integrated directly into enclosure 17.

Guide piece 16 defines within itself curved pin slot 18 that is sized and shaped to accommodate a pin 19 that extends outwardly from actuation lever subassembly 15. Curved pin slot 18 guides pin 19 during motion of carrier 10, either motion in the direction of arrow 11 to insert carrier 10 into enclosure 17, or in the direction of arrow 12 to remove carrier 10 from enclosure 17. Curved pin slot 18 also guides pin 19 during rotation of movable service lever 20 over a fixed range about pivot 21.

Actuation lever subassembly 15 is oriented so that service lever 20 rotates generally upwardly from its position when carrier 10 is fully installed in enclosure 17 (i.e., pin 19 is fully within curved pin slot 18), to its position (as specifically shown in FIG. 2) when carrier 10 has been extracted from enclosure 17.

This is the preferred orientation, so that, as perhaps best shown in FIG. 1, the push/pull features 24 and 25 do not prevent carrier 10 from lying flat on a surface once it has been removed from enclosure 17. This is not a requirement of the invention in any manner, but it is preferred so that carrier 10 or its contents may be more easily serviced outside of enclosure 17. Alternatively, embodiments having other configurations of push/pull features 24 and 25 that do not prevent carrier 10 from lying flat on a surface are within the scope of the invention. For example, it is possible to replace or otherwise modify push/pull features 24 and 25 so that they did not extend into the surface. It is also possible to omit push/pull features 24 and 25 entirely and rely on features such as finger holes 23 and 27, which are themselves preferred but optional features.

To emphasize this point, FIGS. 3–7 are closeup perspective views of various components of the invention that would be suitable for an embodiment in which service lever 20 rotates generally downwardly from its position when carrier 10 is fully installed in enclosure 17. As noted earlier, actuation lever subassemblies 14 and 15 are preferred to be mirror-image symmetric with each other, and therefore one could equivalent consider these Figures to be simply reverse perspective views of the embodiment in which service lever 20 rotates generally upwardly.

Figure 3:
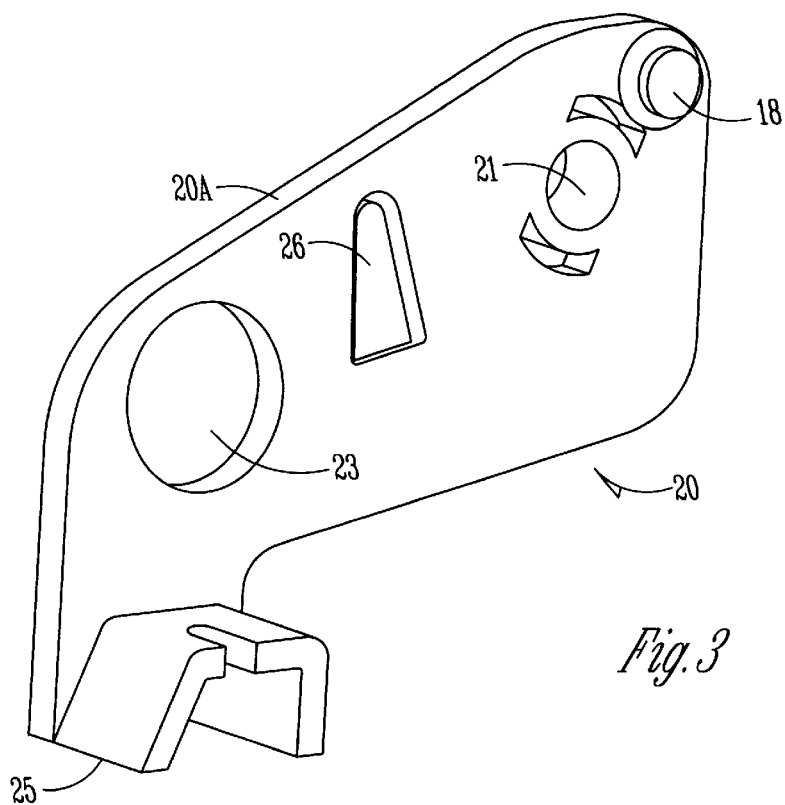
FIGS. 3–8 are closeup perspective views of components of the embodiment of FIGS. 1 and 2.
Figure 4:
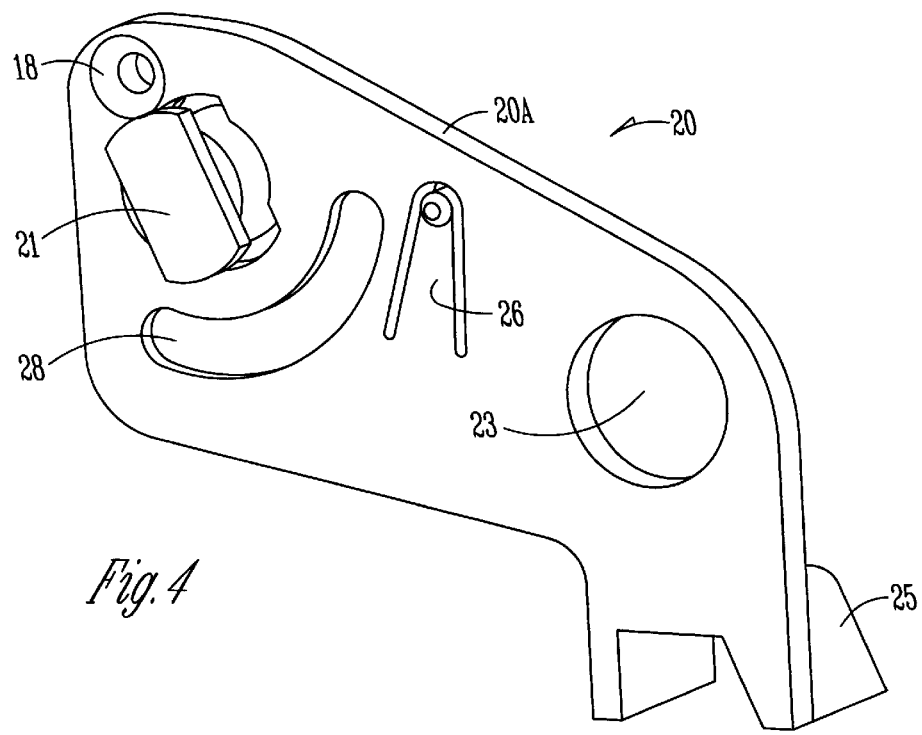
Figure 5:
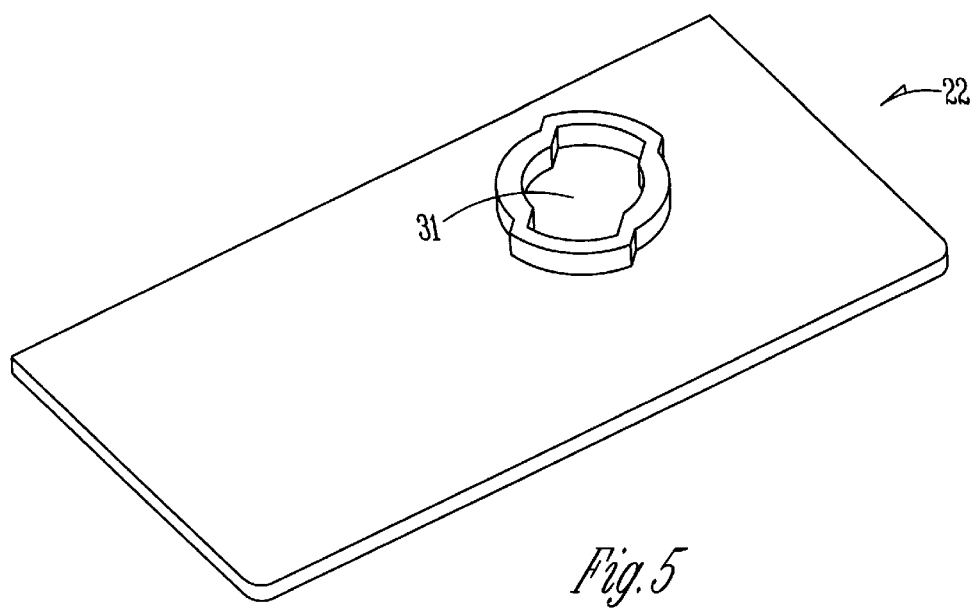
Figure 6:
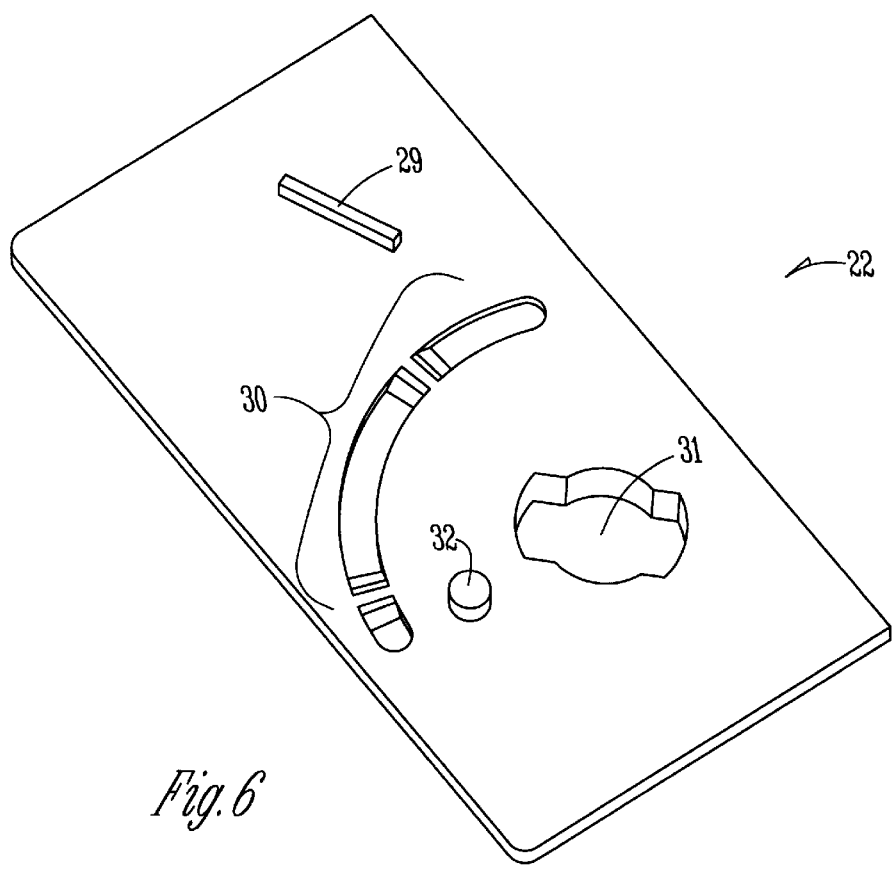

FIG. 3 and FIG. 4 are front and back views, respectively, of service lever 20. Similarly, FIGS. 5 and FIG. 6 are front and back views, respectively, of a portion of carrier 10. For purposes of illustration only, this portion of carrier 10 is illustrated as a separate service plate 22, which could be attached to the side of carrier 10 by any convenient means (not shown). The scope of the invention does not require a separate service plate 22; instead, the features and functions of service plate 22 may be integrated directly into carrier 10.

In addition to the features discussed earlier, FIGS. 3 and 4 show in detail up/down positioning detent 26, rotation slot 28 (which does not extend entirely through the thickness of service lever 20 and therefore is shown in FIG. 4 only), and forward side 20a of service lever 20. FIGS. 5 and 6 show lever pivot hole 31. FIG. 6 additionally shows lever lock 29, up/down positioning channel 30, and rotation pin 32. Lever lock 29 engages forward side 20a of service lever 20, and rotation pin 32 engages rotation slot 28. These features are preferred, but not required, to ensure that service lever 20 rotates in its desired range of motion. Similarly, up/down positioning feature 30 engages up/down positioning detent 26 to provide a feel of locking service lever 20 in place at each end of its range of motion. The operation of all these features is conventional and therefore similarly performing features having other designs could be substituted for the particular features shown.

Pivot 21 fits into lever pivot hole 31 to permit rotation of service lever 20. Inserting pivot 21 of service lever 20 into lever pivot hole 31, and rotating the two relative to each other until the various pairs of engaging features described immediately above seat in place, produces actuation lever subassembly 15, as shown in FIG. 7.

Figure 7:
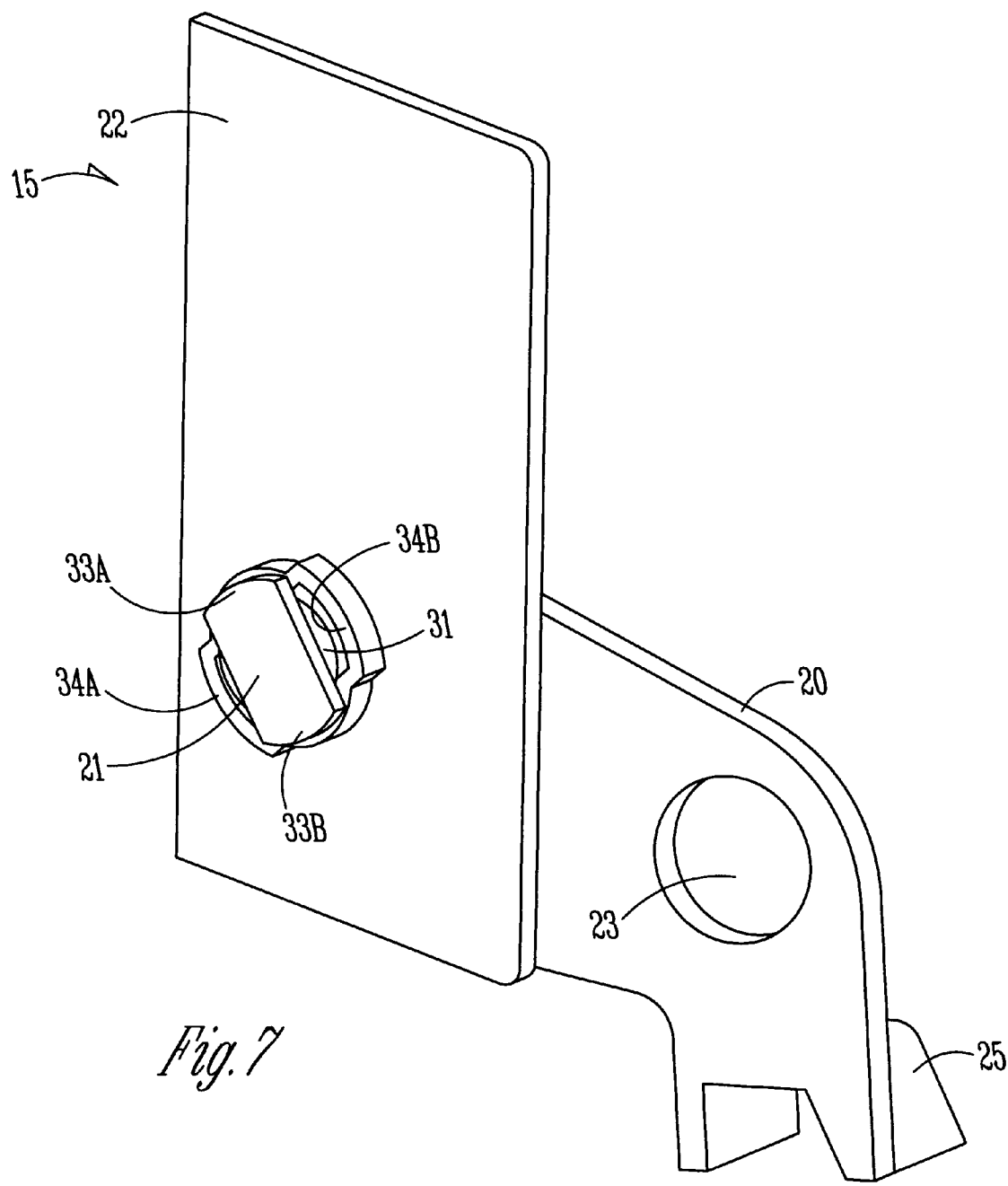

In the preferred embodiment shown in FIG. 7, pivot 21 comprises at least one (as illustrated, two), radially shaped pivot extensions 33a and 33b that dovetail in shape and size with pivot hole extensions 34a and 34b, respectively. These features are oriented with respect to each other around the axis of rotation of pivot 21. As illustrated, they are approximately ninety degrees apart, but this value is only preferred and not limiting of the scope of the invention. In general, the angle depends on the design of the extension features as well as the design and location of the various features that ensure that service lever 20 rotates over its desired fixed range. Once pivot 21 has been inserted and then rotated over this angle, the other features on service lever 20 and service plate 22 (as described above) engage each other, thus preventing reverse motion by the same amount. This ensures that once service lever 20 and service plate 22 have been assembled into actuation lever subassembly 15, they do not become separated again as service lever 20 is repeatedly used to insert or extract carrier 10 into or from enclosure 17. The assembly of service lever 20 into service plate 22 is accomplished without special tools, which provides a manufacturing advantage.

Figure 8:
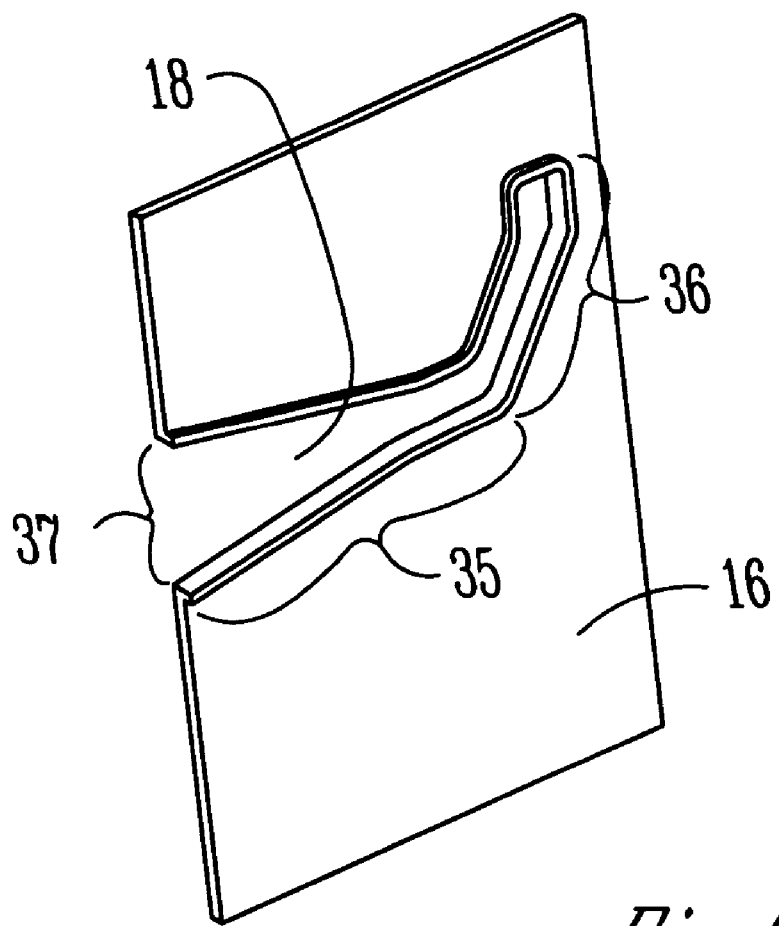

FIG. 8 shows a closeup perspective view of curved pin slot 18. In the preferred embodiment shown in FIG. 8, pin slot 18 comprises two major portions, a first portion 35 that is substantially parallel to the direction of insertion or removal, and a second portion 36 that is oriented in a substantially different direction than the direction of insertion or removal. In a preferred embodiment, the substantially different direction is such that the second portion 36 is substantially non-parallel to the direction of the first portion 35. However, it is not necessary for the second portion 36 to be so substantially non-parallel as to form a right angle with the first portion 35, an example of which is illustrated by the approximately forty-five degree angle shown in the preferred embodiment of FIG. 8.

The particular value of the angle between the two portions does not limit the scope of the invention, but rather it is one of several parameters that may be balanced against each other to form an embodiment of the invention in accordance with the functions and design considerations described here. Similarly, while in no manner limiting to the scope of the invention, it has been found that the first portion 35 and second portion 36 may be approximately two and one-quarter inches (5.72 cm) and approximately one inch (2.54 cm) in length, respectively. These dimensions are suitable for a pin 19 having a diameter of approximately three-eighths of an inch (0.95 cm). The mouth 37 may be any width greater than the diameter of pin 19, and it has been found that approximately one inch (2.54 cm) is suitable. Another consideration is the amount of force that is desirable to tolerate in the insertion or removal of carrier 10 from enclosure 17, a factor that is somewhat subjective but easily within the skill of the art to accommodate. One related design consideration is whether there are also features outside the scope of the invention, such as EMI shielding (not shown) and other features intended to create a close or tight fit between carrier 10 and enclosure 17. Again, the design parameters that such features may present to a particular embodiment of the invention are within the skill of the art.

Inserting carrier 10 into enclosure 17 places pin 19 at mouth 37 of the first portion 35, but as illustrated first portion 35 narrows from mouth 37 in the direction of second portion 36. This feature is preferred but not required so that carrier 10 may be inserted with relatively little accuracy. In an embodiment in which insertion can be accomplished with high accuracy, the narrowing of first portion 35 is not necessary. First portion 35 is not so wide, however, that it permits substantial rotation of service lever 20. Substantial rotation of service lever 20 is permitted, however, once carrier 10 has been inserted into enclosure 17 far enough to place pin 19 at the junction of first portion 35 and second portion 36. Such rotation moves pin 19 into second portion 36 to thereby hold carrier 10 in place. In the preferred embodiment shown, the closed end of second portion 36 is generally wider than it would be if it were simply rounded off at a radius corresponding to half the width of section portion 36. This produces a region in which the shape and size of pin 19 form a more ergonomically pleasing hold of carrier 10 in enclosure 17, because pin 19 seats and unseats from the wider portion more firmly than it would otherwise.

To remove carrier 10 from enclosure 17, the process is reversed. Initially, service lever 20 may be rotated without substantially removing carrier 10 from enclosure 17, because pin 19 moves through the second portion 36 until it reaches the junction of the second portion 36 with first portion 35. At that point, carrier 10 may be removed from enclosure 17 by pulling on service lever 20, during which time pin 19 will travel through the first portion 35 to leave curved pin slot 18 at mouth 37.

The components of the invention may be manufactured from materials appropriate for the stresses that would be likely encountered during manufacturing and repeated insertion and removal in use, as described above. The preferred materials for service lever 20 (and service plate 22, if used) include plastics such as polycarbonates, ABS, blends of these and other materials, such as glass, and other conventional materials known in the art. The preferred materials for guide piece 16 (or that portion of enclosure 17 corresponding to it) include cast zinc, aluminum, and steel.

As is well-known, electronics equipment (including printed circuit boards) can be oriented in virtually any direction. Thus, as used in the entire disclosure above, the terms "horizontal," "vertical," "upward," "lateral," etc. identify only relative directions with respect to the circuit board or boards held by the carrier, regardless of absolute orientation.

I claim:

1. A method of inserting a printed circuit board carrier into an enclosure, comprising:
   a) providing on the carrier a lever that is rotatable over a fixed range, the lever comprising a pin extending outwardly from the lever;
   b) providing the enclosure with a curved pin slot, sized and shaped to guide the pin during motion of the carrier and rotation of the lever, and having a first portion oriented in a direction substantially parallel to a direction of insertion and a second portion oriented in a substantially different direction than that of the first portion, wherein the second portion has a holding portion;
   c) inserting the carrier into the enclosure such that the shape of the pin slot guides the pin through the first portion of the pin slot without permitting substantial rotation of the lever, to a point at which substantial rotation of the lever is permitted, such rotation moving the pin into the holding portion of the second portion of the pin slot, wherein the pin holds the carrier in the enclosure.

2. The method of claim 1 in which the second portion of the curved pin slot is substantially non-parallel to the direction of insertion.

3. The method of claim 1, wherein the first portion has a generally linear orientation and wherein the second portion has a generally linear orientation.

4. The method of claim 1, wherein the first portion is oriented at approximately a 45 degree angle relative to the orientation of the second portion.

5. The method of claim 1, wherein the holding portion comprises a closed end of the second portion having a region shaped for seating of the pin.

6. The method of claim 1, wherein the first portion is at least as long as the second portion.

7. The method of claim 6, wherein the second portion is at least approximately one inch long.

8. A method of removing a printed circuit board carrier from an enclosure, comprising:
   a) providing on the carrier a lever that is rotatable over a fixed range, the lever comprising a pin extending outwardly from the lever;
   b) providing the enclosure with a curved pin slot, sized and shaped to guide the pin during motion of the carrier and rotation of the lever, and having a first portion oriented in a direction substantially parallel to a direction of removal of the carrier from the enclosure and a second portion oriented in a substantially different direction than that of the first portion, the second portion having a holding portion for holding the pin in place when the carrier is mounted within the enclosure;
   c) without substantially removing the carrier from the enclosure, rotating the lever to extend away from the carrier an amount sufficient to move the pin out of the holding portion of the second portion of the pin slot and into the first portion of the pin slot, and
   d) removing the carrier from the enclosure in the direction of removal.

9. The method of claim 8 in which the second portion of the curved pin slot is substantially non-parallel to the direction of removal.

10. An assembly for use during insertion of a printed circuit board carrier into an enclosure, comprising in combination:
    a) a movable lever, mounted to a printed circuit board carrier so as to rotate over a fixed range, and comprising a pin extending outwardly from the lever; and
    b) a portion of an enclosure that defines a curved pin slot sized and shaped to guide the pin during motion of the carrier and rotation of the lever, and having a first portion substantially parallel to a direction of insertion and a second portion oriented in a direction substantially different than the direction of the first portion, wherein the second portion has a holding portion;
    such that during insertion of the carrier into the enclosure, the pin slot guides the carrier through the first portion of the pin slot, without permitting substantial rotation of the lever, to a point at which substantial rotation of the lever is permitted, such rotation moving the pin into the holding portion of the second portion of the pin slot, wherein the pin holds the carrier in the enclosure.

11. The assembly of claim 10 in which the second portion of the curved pin slot is substantially non-parallel to the direction of insertion.

12. The assembly of claim 10, wherein the first portion has a generally linear orientation and wherein the second portion has a generally linear orientation.

13. The assembly of claim 10, wherein the first portion is oriented at approximately a 45 degree angle relative to the orientation of the second portion.

14. The assembly of claim 10, wherein the holding portion comprises a closed end of the second portion having a region shaped for seating of the pin.

15. The assembly of claim 10, wherein the carrier includes a positioning channel and the movable lever includes a positioning detent slidingly coupled to the positioning channel.

16. The assembly of claim 10, wherein the first portion is at least as long as the second portion.

17. The assembly of claim 16, wherein the second portion is at least approximately one inch long.

18. An assembly for use during removal of a printed circuit board carrier from an enclosure, comprising in combination:
   a) a movable lever, mounted to a printed circuit board carrier so as to rotate over a fixed range, and comprising a pin extending outwardly from the lever; and
   b) a portion of an enclosure that defines a curved pin slot sized and shaped to guide the pin during rotation of the lever, and having a first portion substantially parallel to a direction of removal and a second portion oriented in a direction substantially different from the direction of removal, the second portion having a holding portion for seating the pin when the carrier is mounted within the enclosure;

such that during removal of the carrier from the enclosure, the pin resides within the second portion of the pin slot, which second portion holds the carrier in place while the lever rotates away from the carrier an amount sufficient to permit removal of the carrier from the enclosure by pulling on the lever while the pin moves though the first portion of the pin slot.

19. The assembly of claim 18 in which the second portion of the curved pin slot is substantially non-parallel to the direction of removal.

* * * * *